United States Patent [19]
Hunt et al.

[11] Patent Number: 6,013,318
[45] Date of Patent: *Jan. 11, 2000

[54] METHOD FOR THE COMBUSTION CHEMICAL VAPOR DEPOSITION OF FILMS AND COATINGS

[75] Inventors: Andrew T. Hunt, Atlanta; Joe K. Cochran, Marietta; William Brent Carter, Atlanta, all of Ga.

[73] Assignee: Georgia Tech Research Corporation, Atlanta, Ga.

[*] Notice: This patent is subject to a terminal disclaimer.

[21] Appl. No.: 09/161,571

[22] Filed: Sep. 28, 1998

Related U.S. Application Data

[63] Continuation of application No. 08/829,474, Mar. 28, 1997, Pat. No. 5,863,604, which is a continuation of application No. 08/416,435, Apr. 3, 1995, Pat. No. 5,652,021, which is a continuation of application No. 08/036,554, Mar. 24, 1993, abandoned.

[51] Int. Cl.⁷ .............................. C23C 16/00; C23C 4/00
[52] U.S. Cl. ..................... 427/248.1; 427/250; 427/453; 427/454; 427/455
[58] Field of Search .................. 427/248.1, 250, 427/453, 454, 455

[56] References Cited

U.S. PATENT DOCUMENTS

| | | |
|---|---|---|
| 3,642,521 | 2/1972 | Moltzan et al. ............... 117/105.2 |
| 3,849,057 | 11/1974 | Peck . |
| 3,883,336 | 5/1975 | Randall . |
| 4,822,466 | 4/1989 | Rabalais . |
| 4,931,425 | 6/1990 | Kimura . |
| 4,957,591 | 9/1990 | Sato . |
| 4,994,420 | 2/1991 | Paney . |
| 5,002,928 | 3/1991 | Fukui . |
| 5,017,550 | 5/1991 | Shiova . |
| 5,021,399 | 6/1991 | Hsu . |
| 5,026,684 | 6/1991 | Paney . |
| 5,034,372 | 7/1991 | Matsuno . |
| 5,108,983 | 4/1992 | Lackey . |
| 5,174,983 | 12/1992 | Snail . |
| 5,178,905 | 1/1993 | Kanai . |
| 5,275,798 | 1/1994 | Aida . |
| 5,715,788 | 2/1998 | Murayam . |

FOREIGN PATENT DOCUMENTS 62-288842  12/1987  Japan .

OTHER PUBLICATIONS

A.T. Hunt et al. 1993, Combustion Chemical Vapor Deposition: A Novel Thin Film Deposition Technique, Applied Physics Letters, 63: 266–268. No month data.

Withers, J.C. et al., Aluminum Coatings by a Pyrolytic Spray Chemical Vapor Dispostion Process 2d Int'l Conf. on CVD (1970) No month and page data.

Blandenet, G. et al. Indium Oxide Deposition on Glass By Aerosol Pyrolysis, 5th Int'l Conf on CVD (1975) No month and page data.

Hirose, Y. et al., The Synthesis of High Quality Diamond in Combustion Flame, 89–12 Proceedings of the Electrochemical Society (1989). No month and page data.

(List continued on next page.)

*Primary Examiner*—Roy V. King
*Attorney, Agent, or Firm*—Jones & Askew LLP

[57] ABSTRACT

A method for applying coatings to substrates using combustion chemical vapor deposition by mixing together a reagent and a carrier solution to form a reagent mixture, igniting the reagent mixture to create a flame, or flowing the reagent mixture through a plasma torch, in which the reagent is at least partially vaporized into a vapor phase, and contacting the vapor phase of the reagent to a substrate resulting in the deposition, at least in part from the vapor phase, of a coating of the reagent which can be controlled so as to have a preferred orientation on the substrate, and an apparatus to accomplish this method.

54 Claims, 11 Drawing Sheets

OTHER PUBLICATIONS

Merkle, B.D. et al., Superconducting $YBa_2Cu_3O_x$ Particulate Produced by Total Consumption Burner Processing, A124 Mat. Sci. Eng. 31–38 (1990). No month data.

Hori, S. et al., Characterization and Processing of CVD Powders for Fabrication, 155 Mat. Res. Soc. Symp. Proc. 3–13 (1989). No month and page available.

Abe, T. et al., Microcrystalline Diamond Deposition Using a Combustion Flame, 59(8) Appl. Phys. Lett. 911–913 (1991) No month data.

Han. O.Y. et al., High Rate Deposition of Diamond Using Liquid Organic Precursors, 91–8 Proc. The Electrochem. Soc. 115–122 (1991). No month data.

Hirose, Y., Combustion Flame Diamond Coating Method, Applications of Diamond Films and Related Materials (1991). No month and page data.

Hori, S. et al., *Characterization and Processing of CVD Powders for Fabrication of Composite and Compound Ceramics;* MRS Symposium Proceedings, vol. 155, pp. 3–12, 1989. No month data.

Smith et al., Where Do We Go From Here?, vol. 73, No. 12, Dec. 1994. No page data.

McHale et al. Preparation of High–Tc Oxide Films via Flaming Solvent Spray, Journal of Superconductivity, vol. 5, No. 6, 1992. No page data.

METHOD FOR THE COMBUSTION CHEMICAL VAPOR DEPOSITION OF FILMS AND COATINGS

CROSS REFERENCE TO RELATED APPLICATIONS

This application is a continuation of U.S. application Ser. No. 08/829,474, filed on Mar. 28, 1997, now U.S. Pat. No. 5,863,604, which is a continuation of U.S. application Ser. No. 08/416,435, filed on Apr. 3, 1995, now U.S. Pat. No. 5,652,021, which is a continuation of U.S. application Ser. No. 08/036,554, filed on Mar. 24, 1993, now abandoned.

BACKGROUND OF THE INVENTION

1. Field of the Invention

The field of this invention is related generally to the combustion chemical vapor deposition of reagents by flame onto a substrate under generally ambient conditions, and more specifically to the flame combustion chemical vapor deposition from vapor reagents and/or reagents dissolved in or carried by a flammable liquid organic solution which is burned with an oxidant, vaporizing the reagent, and then depositing the coating from the vapor phase onto a substrate positioned in the resulting hot gas in or just beyond the flame's end.

2. Prior Art

Over the last century numerous thin film deposition methods have been developed and commercialized. Thin films usually are considered to be less than 10 microns thick. The Handbook of Thin-Film Deposition Processes and Techniques (Noyes Pubs. 1988; Schuegraf, K. K. editor) provides a broad review of thin-film deposition techniques. Of these technologies, chemical vapor deposition, spray deposition and thermal spraying deposition are the most related deposition techniques.

Chemical Vapor Deposition (CVD) is a materials synthesis process in which constituents of the vapor phase react chemically near or on a substrate surface to form a solid product. In most cases, gas phases flow into a reaction chamber where CVD occurs. The reaction occurs at an elevated temperature which is provided by a furnace or by a method, usually RF induction or high-intensity radiation lamps, to heat the material substrate that is to be coated. Plasma, microwave, photo, laser, RF, and electron-enhanced CVD processes have all been developed. Since a reaction chamber and secondary heat source are mandatory with these processes, they are quite different from the combustion CVD (CCVD) of the present invention, which can be conducted in open-atmosphere without the need for a secondary heat source.

In the 1940's, a CVD process utilizing a flame to produce homogeneously nucleated (powder) oxides of titanium, zirconium, iron, aluminum, and silicon was developed as disclosed in Swiss Patent No. 265192. By injecting a metal halide vapor and oxygen mixture through the central nozzle of a burner, fuel gas through an intermediate ring, and oxygen through the outer ring, a flame was produced from the burner. The 950° C. to 1000° C. temperature of the flame caused oxidation of the metal halide vapor, which condensed to form very fine oxide powders.

U.S. Pat. Nos. 2,239,551, 2,272,342, and 2,326,059 were granted for producing glass and glass coatings in a flame using combustible gases and the vapor of a hydrolyzable compound of silicon solely or with other possible volatile compounds providing one or more additional oxides such as titania or alumina. These methods use only gas and/or vapor source materials to produce glass coatings, whereas the present method uses a liquid solution to produce glass coatings.

Diamond (carbon) films have been deposited utilizing the inner flame region (reducing region) of a combustion flame of acetylene and oxygen with the carbon source provided by the decomposition of acetylene. Hirose, Y., et al., The Synthesis of High Quality Diamond in Combustion Flame, 89–12 Proc. Electrochem. Soc. (1989); Zhu, W. et al., Growth and Characterization of Diamond Films on Non-Diamond Substrates for Electronic Applications, IEEE Proceedings, May 1991, pp. 621–46; Murakawa, M. et al., An Experiment in Large Area Diamond Coating Using a Combustion Flame Torch in its Traversing Mode, Surf. and Coatings Tech., pp. 22–9 (Dec. 5, 1990). Two-component oxide powders have been made via a combustion flame in a reactor using all vapor sources mixed with nitrogen in a hydrogen-oxygen flame. Hori, S. et al., Characterization and Processing of CVD Powders for Fabrication of Composite and Compound Ceramics, 155 Mat. Res. Soc. Symp. Proc. pp. 3–12 (1989). Carbon black coatings form on materials held in or beyond oxygen deficient flames. For diamond and other pure carbon films, the carbon is deposited from the fuel itself; however, with the present method, a reagent from which the coating is formed is introduced in addition to the fuel.

CVD has been accomplished using a sprayed or atomized solution. Groth, R, 14 Phys. Stat. Sol., p. 69 (1966). One such process, the Pyrosol® process, involves the deposition from a vapor produced from an aerosol generated by ultrasonically nebulizing a solution of organic or inorganic compounds into a furnace. Blandenet, G. et al., Indium Oxide Deposition on Glass by Aerosol Pyrolysis, 5th Int'l. Conf. on CVD, p. 190–203 (1975). Another method, Pyrolytic Spray™, produces aluminum coatings by atomizing warmed aluminum alkyl, as either a pure liquid or as a kerosene dilution, over a heated substrate in a reaction chamber. Withers, J. C. et al., Aluminum Coatings by a Pyrolytic Spray CVD Process, Second. Int'l Conf. on CVD, p. 393–402 (1970). These reactions are confined to a reaction chamber or furnace and call for an external heat source. The basic concept is that the atomized liquid vaporizes prior to reaching the substrate, and then reacts on or near the substrate as in conventional CVD. None utilize a flame or combustion, as does the present invention.

CVD has been accomplished by directly feeding reactive powders such as metal-organics or halides into a furnace. Hollabough, C. M. et al., Chemical Vapor Deposition of ZrC Made by Reactions of $ZrCl_4$ with $CH_4$ and with $C_3H_6$, 35 Nucl. Tech., p. 527–35 (1977); U.S. Pat. No. 4,202,931; Lackey, W. J. et al., Rapid Chemical Vapor Deposition of Superconducting $YBa_2Cu_3O_x$, 56–12 Appl. Phys. Lett., pp 1175–7 (1990); U.S. Pat. No. 5,108,983. When viewing this metal-organic powder feeding CVD technique through a specially designed end cap on the furnace, the powders flashed or combusted in the hot zone of the furnace. The quality of films (vapor deposited) produced by this process suggests that the powder metal components are vaporized during burning. This is very different from using a liquid solution, and requires use of a furnace, unlike CCVD.

U.S. Pat. No. 3,883,336 discloses a method of producing glass in a flame which appears to be a CVD process even though CVD is not mentioned. A flame from a combustible gas and oxygen mixture is combined with additional oxygen containing silicon tetrachloride vapor which intersects the aerosol of an aqueous salt mixture producing a transparent, homogeneous glass body consisting of at least two constituent oxides. In one of the examples listed, a methanol solution is nebulized and burned by the intersecting flame. The claims only cite the use of aqueous solutions. This procedure is more complicated than CCVD, requiring two nozzles. Further, this procedure is used to make glass bodies and forms, not coatings and films as in CCVD.

Spray pyrolysis is a thin film forming technique in which a solution is sprayed onto a heated substrate, thus forming a film. The film commonly receives additional heat treatment to form the desired phase. One spray deposition method uses metal/2-ethyl hexanoates, spin coated onto a substrate which later is heated to pyrolyze the film and form a $YBa_2Cu_3O_x$ (commonly referred to as '123' by those skilled in the art) film. Gross, M. E. et al., Versatile New Metalorganic Process for Preparing Superconducting Thin Films, Appi. Phys. Lett., pp. 160–2 (Jan. 11, 1988). Another method deposits 123 films by spraying nitrate solutions onto substrates at 180° C. followed by heat treating and annealing. Gupta, A et al., $YBa_2Cu_3O_x$ Thin Films Grown by a Simple Spray Deposition Technique, Appl. Phys. Lett., pp. 163–5 (Jan. 11, 1988). A third method, U.S. Pat. No. 5,002,928, forms oxide superconducting films by ultrasonic wave spraying a homogeneous solution or solutions, organic or inorganic, containing as solutes the metal compounds capable of forming the superconductor onto a heated substrate to form the thin film. The substrate temperature can be high enough so that later firing is not needed. These processes do not have a flame and do require heating of the substrate during and/or after deposition, unlike the CCVD of the present invention.

Most thermal spraying methods produce thick films (>10 microns) by feeding powder into a gas combustion torch (flame spraying) apparatus or a plasma torch (plasma spraying) device to melt the powdered coating material, which then is splattered onto the object being coated, thus forming a film. Matejka, D. et al., Plasma Spraying of Metalic and Ceramic Materials (John Wiley & Sons, 1989). Thermal spraying in general is considerably different from CVD and CCVD. An extension of thermal spraying is physical vapor deposition by vaporizing the powdered material, in which the boiling point of the material is exceeded in the thermal sprayer. The resulting vaporized materials then condense on the cooler substrate. This evaporation technique was used early in high temperature superconductor research, and formed c-axis preferred orientation of $YBa_2Cu_3O_x$ at deposition rates of up to 10 microns/min. Terashima, K., Preparation of Superconducting Y—Ba—Cu—O Films by a Reactive Plasma Evaporation Method, Appl. Phys. Lett., pp. 1274–6 (Apr. 11, 1988). When only a melting of the $YBa_2Cu_3O_x$ was performed, no preferred orientation to the deposited $YBa_2Cu_3O_x$ was observed, and the resulting electrical properties were similar to bulk materials. Pawlowski, L. et al., Properties of Plasma Sprayed 123 High Temperature Superconductors, Proc. Third National Thermal Spray Conf., p. 641–6 (May 1990). Most thermal spray processes try to minimize the amount of evaporated powder, because this reduces the efficiency, that is, the ratio of deposited material to in-fed material, of the deposition process. Varacalle, D. J. et al., Plasma Spraying of Zirconia Coatings, 155 Mat. Res. Soc. Symp. Proc., pp. 235–46 (1989). The films resulting from this process can be very similar to CVD films, but the process is different.

A variation of flame spraying is the feeding of a solution instead of a powder-into a flame. Atomized nitrate solutions of Y, Ba and Cu have been reacted in an oxyhydrogen flame to produce fine superconducting powders. Zachariah, M. R. et al., Aerosol Processing of YBaCuO Superconductors in a Flame Reactor, 6 J. Mater. Res., No. 2, pp. 264–9 (February 1991); Merkle, B. D. et al., Superconducting $YBa_2Cu_3O_x$ Particulate Produced by Total Consumption Burner Processing, A124 Mat. Sci. Eng., pp. 31–8 (1990). The flame vaporizes the water, leaving the Y, Ba and Cu nitrate particles which react with the flame's OH and O radicals, causing oxidation to yield a $YBa_2Cu_3O_x$ particle. A stoichiometric $H_2$–$O_2$ flame temperature is about 2600° C. at atmospheric pressure, but the flume is cooled, by the solution and the addition of Ar, to the 700–1100° C. range so that vaporization of Y, Cu and Ba is minimized. In this variation, the heat source is not the solution, and the end material is a powder. The best powders were made using a diffusion flame with a flame temperature of 700–900° C., likely resulting from an over-ventilated diffusion flame, because of the reduced flame temperature in which $YBa_2Cu_3O_x$ is a stable phase and the decreased concentration of water vapor minimizing the formation of $BaCO_3$. The resulting $YBa_2Cu_3O_x$ particles deposited on a platinum substrate just beyond the flame typically are in the 20 to 300 nanometer range. The flame also heated the substrate to a temperature of 550–650° C. The resulting 200 micron thick film from a one hour deposition was particulate in nature with no preferred orientation.

As can be seen, the prior art chemical vapor deposition processes require very specific operating conditions, apparatuses and reactants and carriers. Even with such parameters, many of the prior art processes result in thick films or films with no preferred orientation. Thus, it can be seen that a simple chemical vapor deposition method and apparatus is highly desired but not available. It is to this goal that the present method and apparatus is directed; that is, a flame combustion chemical vapor deposition process in which the reagents are mixed with an oxidant, passed through a torch and burned to form a hot gas containing the vaporized reagents, which is then contacted with a substrate, resulting in the desired coating being deposited on the substrate.

BRIEF SUMMARY OF THE INVENTION

The present invention is a new processing method of and apparatus for chemical vapor deposition (CVD), termed combustion CVD (CCVD). The key to the invention is the direct combustion of flammable liquids or vapors which contain the elements, or reagents, to be deposited on a substrate material. Organic solvents are sprayed or atomized in an oxidizing gas and burned. In the preferred embodiment, the materials to be deposited are in solution; therefore, the mixture is uniform, making the deposition of multicomponent films easier.

The substrate material to be coated does not need to be heated in a furnace or reaction chamber. The heat of combustion provides the needed conditions for the reaction of the reagents. The substrate material being coated is likewise heated by the combustion flame, creating the proper kinetic environment for surface reactions, diffusion, film (coating) nucleation and film (coating) growth. The substrate material being coated needs to be located in a zone proximate to the flame's end so that the solutes are dispersed in the hot combustion gases, but not so far from the flame's end that homogeneous nucleation in the gas stream occurs. By diluting the solution, homogeneous nucleation can be inhibited.

The solutes used need to be properly reactive to form the desired coating. While oxides are the preferred material, other elemental coatings and compounds, for example nitrides, carbides, and carbonates, also can be deposited. An example of an elemental metal coating is silver if the substrate temperature is maintained above the AgO stability temperature. It also is possible to supply only enough oxygen to partially burn the solution so as to form a hot gas which is reducing, and then deposit a material which needs a reducing environment to form.

The method is a simple and inexpensive method for producing many of the same or similar materials which currently are produced by other chemical vapor deposition methods. With a furnace not being necessary, and being conducted in an open-atmosphere environment, much greater flexibility is provided. Large and unusual shapes can be coated completely or only in certain areas as the flame is directed. The invention will become more apparent to one skilled in the art when the following detailed description of the preferred embodiments is read in conjunction with the appended figures.

DETAILED DESCRIPTION OF THE PREFERRED EMBODIMENTS

Figure 1B:
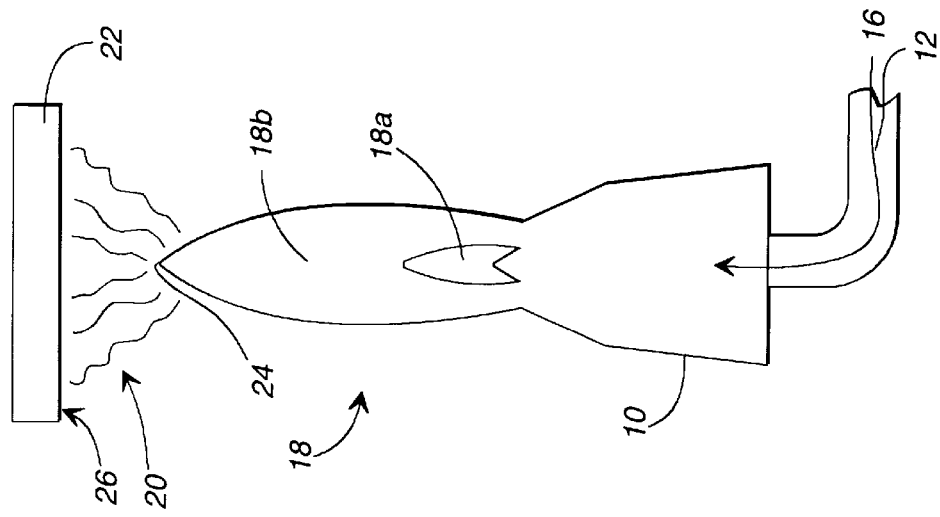
FIG. 1 is a schematic of the combustion chemical vapor deposition apparatus of the present invention.

Combustion CVD (CCVD) is the vapor deposition of a film onto a substrate near or in a flame which causes the reagents fed into the flame to chemically react. The present invention discloses CCVD of crystalline, inorganic films beyond the simple carbon black or diamond films, and glass coatings (utilizing a sprayed solution) of the prior art. Flammable organic solvents containing elemental constituents of the desired coating in solution as dissolved reagents are sprayed through a nozzle and burned. Alternatively, vapor reagents can be fed into the flame and burned. Likewise, non-flammable solvents can be used with a gas-fueled flame. An oxidant, such as oxygen, is provided at the nozzle to react with the solvent during burning. Upon burning, reagent species present in the flame chemically react and vaporize, and then deposit and form a coating on a substrate held in the combustion gases in or just beyond the flame's end. During the deposition of oxide coatings, oxygen is available from at least three possible sources: the oxidant gas; the surrounding gases; and the dissolved chemical reagents.

In CCVD, the environment required for CVD to occur is provided by the flame. No furnace, auxiliary heating, or reaction chamber is necessary. Further, CCVD can be carried out in open-atmosphere conditions. The flame supplies the energy needed for CVD in the forms of the kinetic energy of the species present and radiation. This energy creates the appropriate thermal environment to form reactive species and coincidentally heats the substrate, thus providing the conditions for surface reactions, diffusion, nucleation, and growth to occur. When using combustible solutions, the solvent plays two primary roles in CCVD. First, the solvent conveys the coating reagents into the vicinity of the substrate where CVD occurs, thereby allowing the use of low cost soluble precursors. Uniform feed rates of any reagent stoichiometry can be produced easily by simply varying the reagents concentrations in solution and the solution flow rate. Second, combustion of the solvent produces the flame required for CCVD.

In general, CCVD is performed under ambient conditions in the open atmosphere to produce a film on a substrate. The film preferably is crystalline, but may be amorphous, depending on the reagent and deposition conditions used. The reagent, or chemically reactive compound, is dissolved or carried in a solvent, typically a liquid organic solvent, such as an alkene, alkide or alcohol. The resulting solution is sprayed from a nozzle using oxygen-enriched air as the propellant gas and ignited. A substrate is maintained at or near the flame's end. Flame blow-off may be prevented by use of a hot element such as a small pilot light. The reactants vaporize in the flame and are deposited on the substrate as a film. Resulting films (coatings) have shown extensive preferred orientation in X-ray diffraction patterns, evidencing that CVD occurred by heterogeneous nucleation and resulting in a film having a preferred orientation.

Alternatively, depositions can be performed by feeding solution through a nebulizer, such as a needle bisecting a thin high velocity air stream forming a spray which is ignited and burned. In this manner, other materials such as $Y_2O_3$ stabilized $ZrO_2$ (YSZ), are deposited onto substrates, such as single crystal MgO and sapphire substrates. Two different solvents, ethanol and toluene, and two different metal-organic precursors, acetylacetonates (AcAc) and 2-ethylhexanoate are preferred and were used in the depositions of YSZ given as examples herein. Other reactants and solvents are appropriate and will function in the present invention, as long as a flame can be created which will vaporize the reactants. For example, coatings of $BaTiO_3$, $Y_2BaCuO_5$, YIG ($Y_3Fe_5O_{12}$), and Ag also have been deposited.

By considering flame concepts, certain deposition conditions are preferred. First, the substrate needs to be located in a zone such that it is heated by the flame's radiant energy and the hot gases produced by the flame sufficiently to allow surface diffusion. This temperature zone is present from about the middle of the flame to some distance beyond the flame's end. The temperature of the flame can be controlled to some extent by varying the oxidant-to-fuel ratio as well as by adding non-reactive gases to the feed gas or non-combustible miscible liquids to the solution. Secondly, the metal complexes need to be vaporized and chemically changed into the desired state. For oxides, this will occur in the flame if sufficient oxygen is present. The high temperatures, radiant energy (infrared, ultraviolet and other radiant energy), and plasma of the flame aid in the reactivity of precursors. Finally, for single crystal films, the material being deposited should be in the vapor phase, and not stable particles. Particle formation can be suppressed by maintaining a low concentration of solutes, and by minimizing the distance, and therefore time, between where the reagents react and where the substrate is located. Combining these different factors predicts the best CVD deposition zone to be in the proximity of the flame's end. If a solution is sprayed, droplets can strike a substrate located too far into the flame, possibly resulting in some spray pyrolysis characteristics in the resulting film. A mixture of CVD and spray pyrolysis may be desired in some films. In fact, in some configurations, with large droplets or with some reactants, it may be impossible to not have some spray pyrolysis occur.

In general, as long as a flame is produced, CCVD can occur, independent of the flame temperature, deposition zone pressure or temperature, or substrate surface temperature. The flame temperature is dependent on the type and quantity of reagent, solvent, fuel and oxidant used, and the substrate shape and material, and can be determined by one skilled in the art when presented with the particular reagent, solvent, fuel, oxidant and other components and conditions for deposition. The preferred flame temperature for the preferred solutions and materials is between about 300° C. and 2800° C. As flames can exist over a wide pressure range, CCVD can be accomplished at a pressure from about 10 torr to about 10,000 torr. Likewise, if a plasma is formed for depositing the coating, the temperature of the plasma can range from about 800° C. to about 10,000° C. The temperature of the substrate during the CCVD process also can vary depending on the type of coating desired, the substrate material, and the flame characteristics. Generally, a substrate surface temperature of between about 100° C. and 2200° C. is preferred.

If the droplets actually contacted the substrate, a mixed deposition technique of both CVD and spray pyrolysis may occur. As a droplet approaches the substrate, the outer surface of the droplet may be enriched in the solutes as the solvent was evaporated. The impacting drop should burn off of the substrate almost instantaneously, possibly cooling and then heating this area, leaving a ring-shaped spot. The ring could be thicker on the outside as more of the solutes would have been concentrated there. This type of deposition might help increase the deposition efficiency, while maintaining heterogeneous nucleation.

Flame chemistry has not been considered in detail as flames are a very complex phenomena and not fully understood chemical reaction environment. However, flame characteristics can be controlled by: varying the gas to fuel ratio beyond stoichiometric to control the flame temperature; altering the type of fuel to effect temperature, luminescence and smoking; mixing the solvents with non-flammable liquids to change the flame characteristics; decreasing the oxygen content to initialize and then increase carbon deposition; depositing non-oxide phases in the reducing environment maintained between the inner and outer flame cones produced with a Smithell separator as shown in FIG. 1c, by feeding reactive gases into the Smithell separator; reducing droplet size to cause a liquid fuel flame to behave like a premixed gas flame, because the solvents are able to vaporize prior to entering the flame; adjusting nozzle configuration and flow rates to control flame shape and velocity, and reducing the pressure because, depending on fuel and oxidizer, many flames are stable down to pressures of 10 torr.

The deposition rate of the coating onto the substrate can vary widely depending on, among other factors, the coating quality, the coating thickness, the reagent, the substrate material and the flame characteristics. For example, longer coating times can result in thicker coatings, assuming a relatively constant feed flow rate to the flame, less porous coatings, assuming a relatively lower feed flow rate to the flame, or more porous coatings, assuming a relatively greater feed flow rate to the flame. Likewise, if a higher quality coating is desired, a longer coating time at a lower feed flow rate may be necessary, while a gross coating can be produced relatively quickly using a greater feed flow rate. One skilled in the art can determine the feed flow rates and deposition times necessary to produce a desired coating. The preferred deposition rates are from 0.1 $\mu$m/hr to 1000 $\mu$m/hr.

Figure 1A:
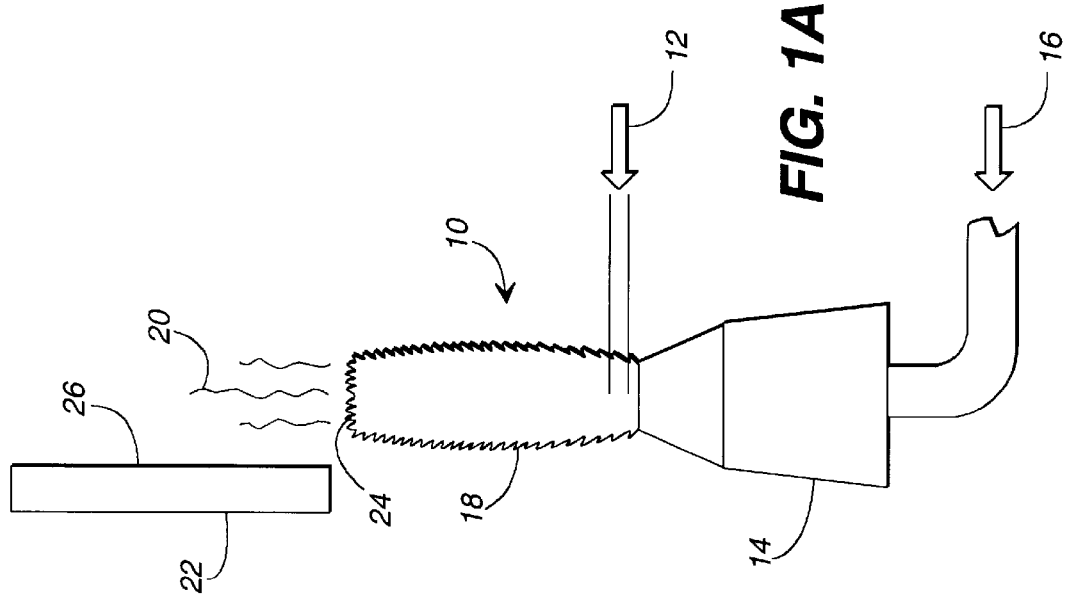

Referring now to FIG. 1a, generalized schematic of the apparatus 10 used to carry out the combustion chemical vapor deposition of the present invention which produces a turbulent flame with no separate inner and outer flames to speak of is shown. A solvent-reagent mixture, which can be flammable or non-flammable solvents mixed with liquid, vaporous or gaseous reagents, but typically is a solvent-reagent solution 12, is supplied to a torch 14 or other flame-producing apparatus. The solvent-reagent solution 12 is ignited in the presence of an oxidant 16, resulting in a flame 18. The solvent-reagent solution 12 may be ignited using any conventional method, and the flame 18 may be maintained, if necessary, by a device such as a conventional pilot light (not shown) or sparker 34 shown in FIG. 1c. As the solvent-reagent solution 12 burns, the reagent vaporizes and leaves the flame 18 along with other hot gases 20 and combustion products. The apparatus 10 shown in FIG. 1b is similar to the apparatus 10 shown is FIG. 1a, but is configured for a non-turbulent flame, suitable for gas reagents and non-flammable carrier solutions. Flame 18 produced by torch 14 of FIG. 1b typically has the general flame characteristics of an inner flame 18a defining the reducing region where the majority of the oxidizing gas supplied with the reagent burns and an outer flame 18b defining the oxidizing region where the excess fuel oxidizes with any oxidizing gas in the atmosphere.

Figure 1C:
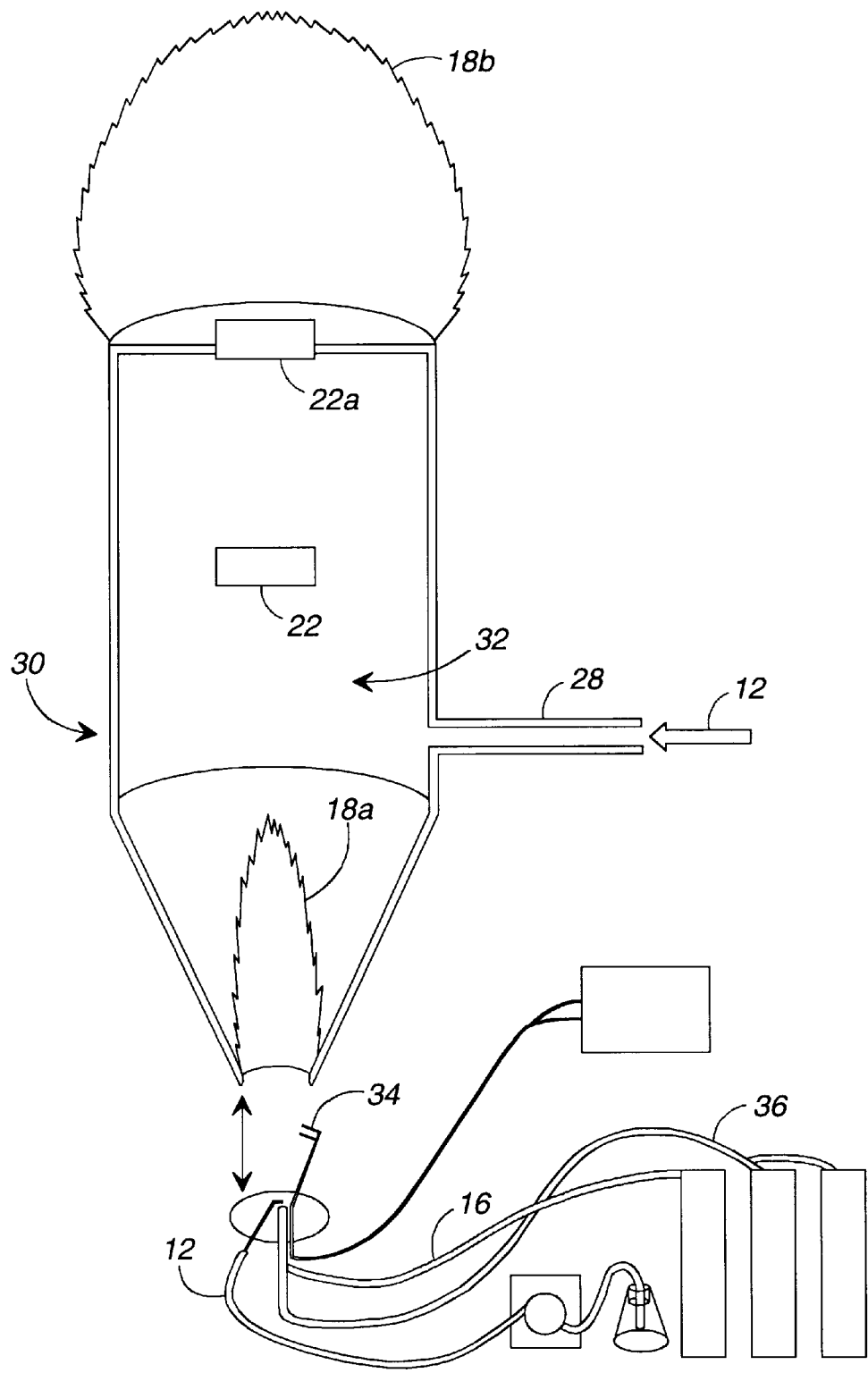

FIG. 1c shows a schematic of a CCVD apparatus using a Smithell separator 30. The substrate 22 can be placed within the reducing region 32 of the Smithell separator 30 between the inner flame 18a and the outer flame 18b. Alternatively, the substrate 22a can be placed at the exit of the Smithell separator 30, yet still within the reducing region 32, such that substrates 22a larger than the cross-section of the Smithell separator 30 may be coated by moving either the substrate or the apparatus. Additional or other reagents can be supplied to the reducing region 32 of the Smithell separator via supply means 28. The apparatus shown in FIG. 1c has a controlled atmosphere in which, by controlling the fuel gas to oxidizing gas ratio, a reducing region (atmosphere) 32 can be created beyond the inner flame 18a. This apparatus allows for the deposition of materials which require a reducing environment to form quality coatings, such as carbides, nitrides and borides. Sparker 34 helps maintain the flame. A fuel 36, such as hydrogen gas $H_2$, $NH_3$ or other gas is added to the solvent-reagent solution 12 before ignition.

The substrate 22 to be coated is located proximal to flame 18, typically at or near the end 24 of flame 18, but always within the hot gases 20 region. It is preferable that the surface 26 of the substrate 22 which is to be coated is placed facing the flame 18 in some manner, either tangentially as shown in FIG. 1a or obliquely as shown in FIG. 1b, or at any angle to the flame 18 such that the hot gases 20 containing the reagent vapor will contact the surface 26 to be coated. However, as shown in Example 4 and FIG. 8, CCVD can occur on the side of the substrate away from the flame, evidencing that CCVD is not limited to line of sight deposition.

In operation, the chemically reactive compound, or reagent, is mixed with a flammable liquid carrier. It is preferable that the reagent be an organic or inorganic compound which will react in the flame's environment and the carrier be a solvent which is an organic compound, although any reagents which can form a coating and any carriers may be used. It also is preferable that the reagent be dissolved in the carrier as a liquid solvent-reagent solution will spray better in the torch 14, and, consequently, flame better, also resulting in a more homogeneous reagent vapor and subsequent coating on the substrate 22. Throughout this specification, the reagent-carrier mixture, in whatever form, is referred to generally as the solvent-reagent solution 12.

The solvent-reagent solution 12 is supplied to the torch 14. The term torch is used in a general sense to describe any apparatus which can produce a flame from a fuel feed. An oxidant 16 also is supplied to the torch 14 in some fashion. As discussed above, the oxidant 16 may be supplied to the torch 14 as a separate feed, may be present in the process atmosphere, may be supplied to the process atmosphere or flame ignition point as a separate feed, or may be present in the reagent. The solvent-reagent solution 12 is ignited in the presence of the oxidant 16, creating the flame 18. The oxidant 16 and the solvent combust in the flame 18. The heat generated by the combustion serves two purposes. First, the heat causes liquid reagent solutions to vaporize. Second, the heat heats the substrate 22 to a temperature at which the reagent will coat suitably the substrate 22 so as to result in a uniform, preferred orientation coating, if desired.

After the liquid reagent is vaporized by the heat of combustion of the oxidant 16 and the solvent, the reagent vapors leave the flame 18 along with other hot gases 20. The substrate 22 to be coated is placed in a position where the reagent vapors will contact the surface 26 of the substrate 22 to be coated. As the reagent vapors contact the surface 26 to be coated, the reagent vapors condense and form a coating. As discussed in more detail below, the coating may have a preferred orientation, showing heterogeneity.

As discussed above, the solvent-reagent solution 12 in the preferred embodiment is a liquid reagent dissolved in a liquid solvent. However, solid, liquid, vaporous and gaseous reagents can be used, with a liquid or gaseous solvent, as long as the feed to the flame 18 is essentially liquid or gaseous in nature. Although liquid solutions are preferred, the solvent-reagent solution 12 also may contain particles of reagent, typically less than 50%, and preferably less than 10%, of the total solvent-reagent solution 12 volume. Likewise, if particles of reagent are present in the solvent-reagent solution 12, particles of reagent may be present in the hot gases 20. Similarly, particles of reagent may be present in the hot gases 20 in any event, whether or not a complete liquid solvent-reagent solution 12 is used, or one containing particles. The presence of reagent particles generally will not compromise the coating, and coatings with up to 50% particulate matter can be created using the instant method and apparatus.

The following conditions are preferred as the optimum conditions. First, the substrate preferably is located in a zone such that it is heated sufficiently by the flame, or heat of combustion of the solvent-reagent solution 12 and oxidant 16, to allow surface diffusion of the coating along the substrate 22. This temperature is present in the flame 18 to some distance beyond the flame's end 24. Secondly, the metal complexes of the reagent preferably is chemically changed to the final state. For oxides this would occur in a zone between the middle of the flame 18 and the flame's end 24. Finally, the material to be deposited must be in the vapor phase, and can not be allowed to grow too large (become stable particles). This can be controlled by maintaining a low concentration of solutes, and by minimizing the distance between the surface 26 to be coated and where the oxidation occurs. Combining these different factors predicts the best depositional zone to be in the proximity of the flame's end 24.

A plasma torch also can be used in a manner similar to a flame to achieve the same CCVD results. Reagents are sprayed through a plasma torch and deposited onto the substrate. The reagents and other matter fed through the plasma torch are heated and, in turn, heat the substrate surface, much like the flame and hot gases heat the substrate surface in the flame embodiment. Both reacting and/or inert gases can be fed into the plasma torch, resulting in suitable conditions for both CVD and CCVD. In plasma torch CCVD, a lower plasma temperature can be used, compared to conventional plasma spraying, as only enough heat is required to chemically react the reagents; the reactions occur at much lower temperatures than that needed to melt the resulting materials as is required with conventional plasma spraying. Such lower temperatures allow the use of less expensive, safer, and more mobile equipment, and the resulting film quality is comparable to other CVD methods.

CCVD is a more versatile coating technique than existing CVD for some applications. The coating of complex shaped and large parts in the field can be accomplished more simply and economically than conventional CVD processes which must be carried out in a reaction chamber or furnace. Interior surfaces of certain parts also are amenable to coating with CCVD.

EXAMPLE 1

A coating of the high temperature superconductor $YBa_2Cu_3O_x$. Metal organic reagents containing the Y—Ba—Cu—O precursors were dissolved in xylene. The resulting solution was sprayed from an air brush using 10 percent oxygen enriched air as the propellant gas and oxidant. A single crystal MgO substrate held by metal wires was placed near the flame's end about a foot from the tip of the air brush. Combustion was maintained using a propane soldering torch at the lowest setting with its flame directed at a 45 degree angle to the direction of spray of the sprayed solution as a pilot flame. The deposition was performed in the open atmosphere with no particular set conditions where the specimen cooled rapidly after being coated.

Figure 2:
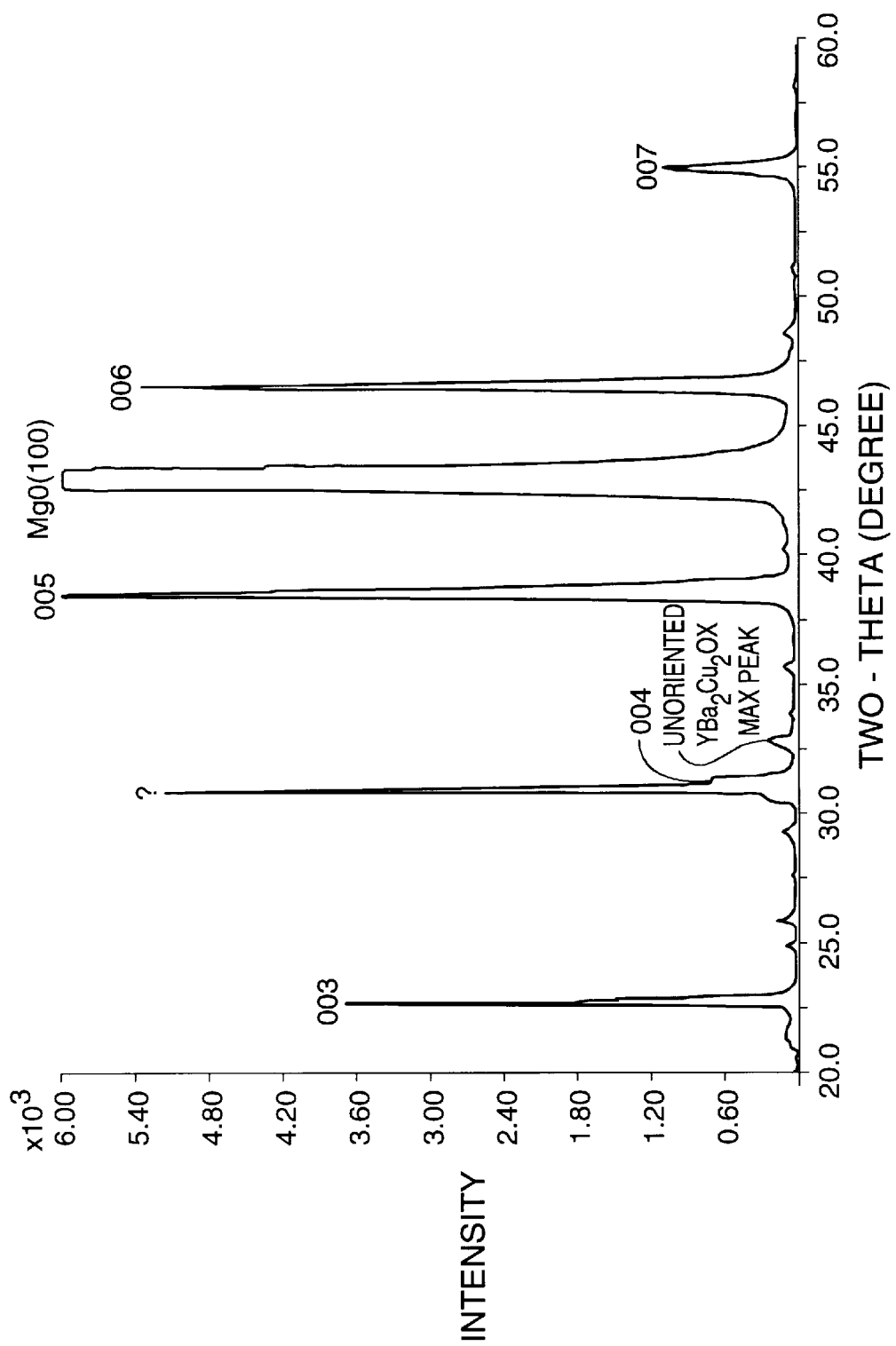
FIG. 2 is an X-ray diffraction pattern of $YBa_2Cu_3O_x$ CCVD coating on a single crystal MgO substrate prior to post-deposition heat treatment.

FIG. 2 is an X-ray diffraction (XRD) pattern obtained from this specimen without any post-processing. This pattern indicates that the film is C-axis oriented, which is evidence that CVD occurred by heterogeneous nucleation. A homogeneously nucleated film would produce an XRD pattern similar to that of a randomly oriented powder of YBCO.

Following the collection of the data presented in FIG. 2, the coating was subjected to the following heat treatment in a quartz tube furnace at atmospheric pressure:

1. Heat to about 830° C. in a 20/80 ($O_2/N_2$) atmosphere;
2. Soak at about 830° C. for about 1 h in 20/80 ($O_2/N_2$) atmosphere;
3. Slow cool to room temperature in 50/50 ($O_2/N_2$) atmosphere.

Figure 3:
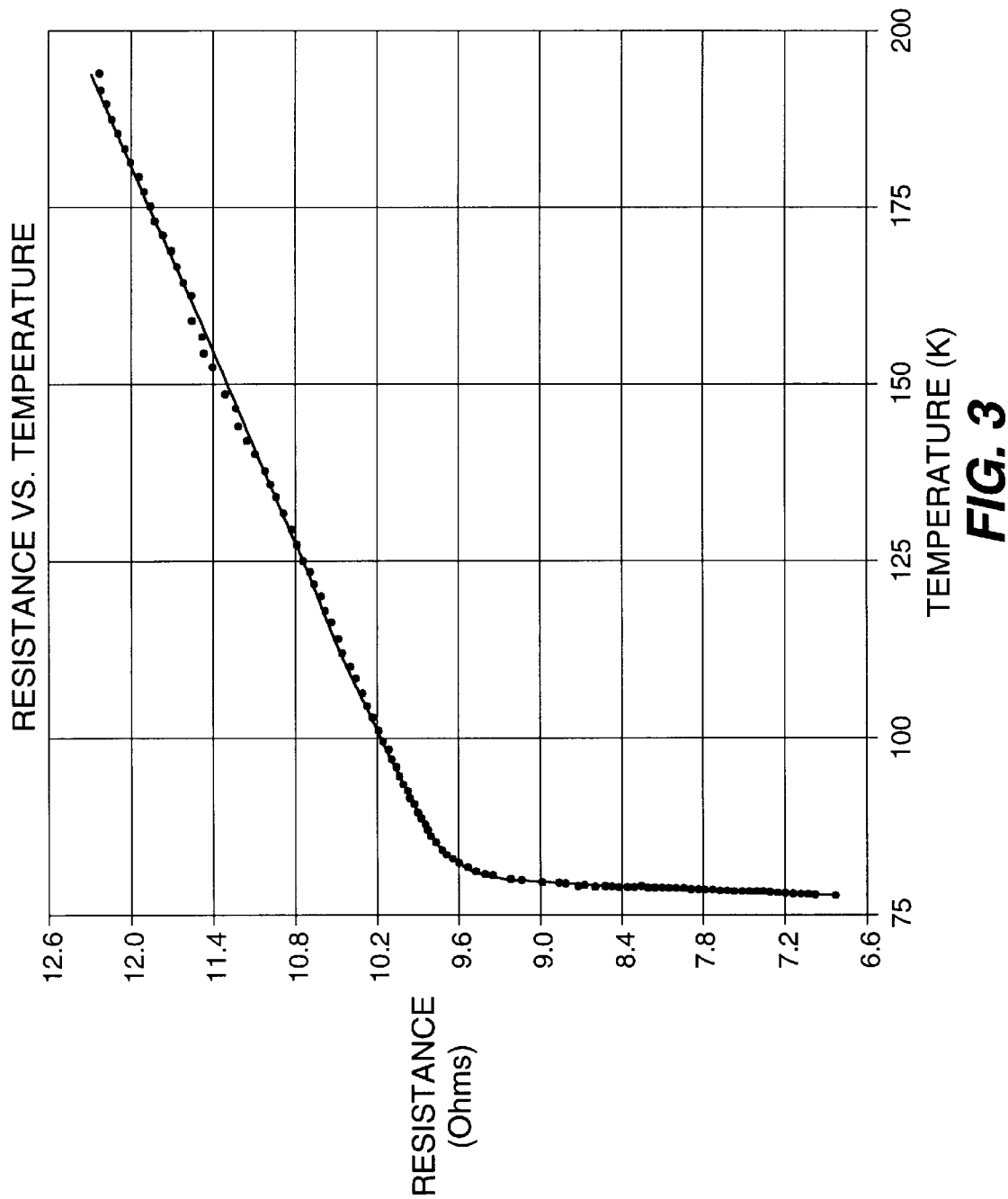
FIG. 3 is a resistance versus temperature graph of $YBa_2Cu_3O_x$ CCVD coating on a single crystal MgO substrate after post-deposition heat treatment.

FIG. 3 presents the results of a four point resistance vs. temperature determination on the heat treated coating. A superconducting transition is evident beginning between 80 and 85 K.

EXAMPLE 2

A CCVD system was constructed in a fume hood to provide more stable and controllable ambient conditions.

$Y_2O_3$ stabilized $ZrO_2$ (YSZ) as the coating material was tested on MgO, $Al_2O_3$ and stainless steel substrates. Two different solvents, ethanol and toluene, and two different metal-organic precursors, 2-ethyl hexanoates (2EH) and acetalacetonates (AcAc), were used.

Figure 6:
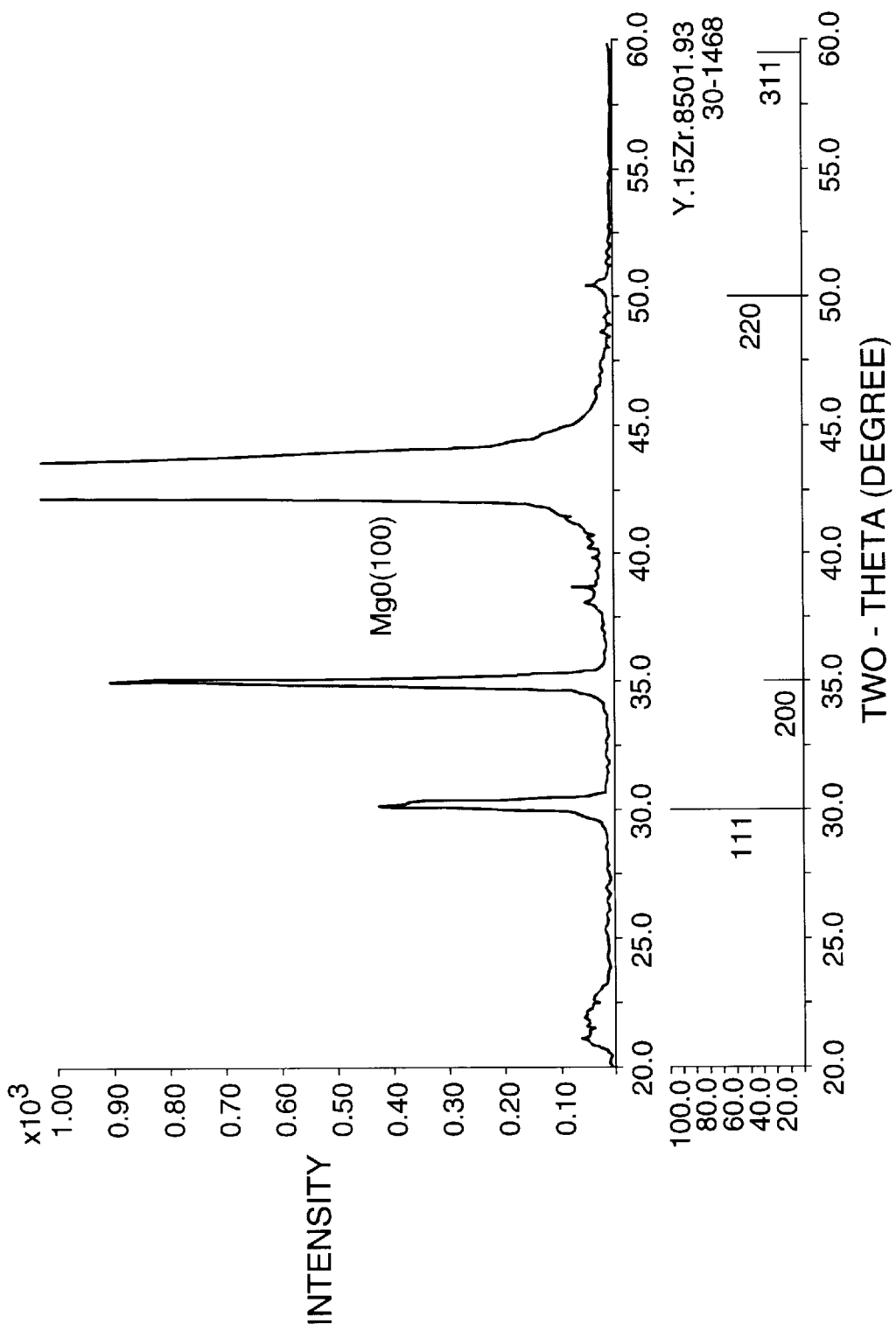
FIG. 6 is an X-ray diffraction pattern of a YSZ CCVD coating on an MgO substrate using AcAc precursors.
Figure 7:
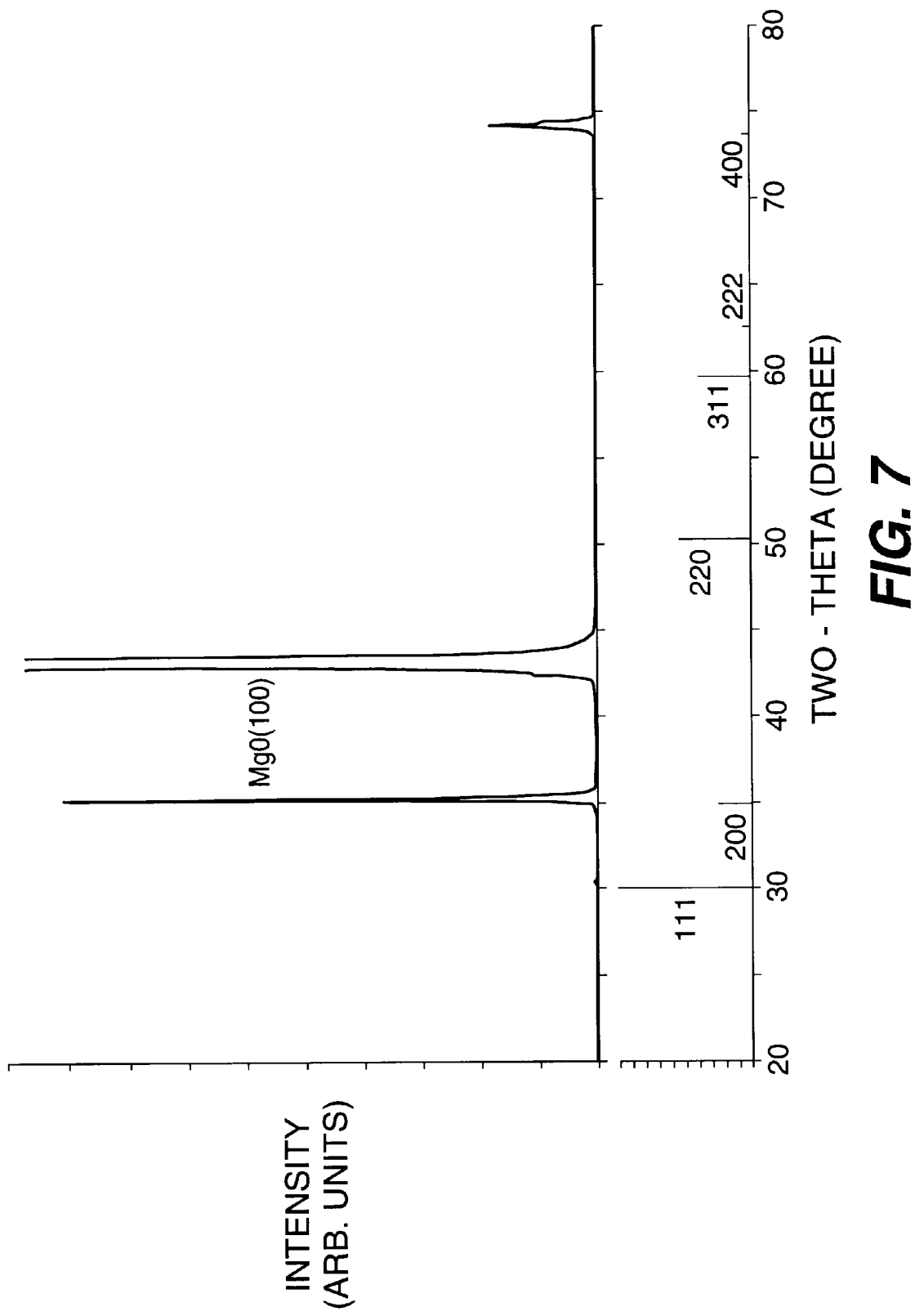
FIG. 7 is an X-ray diffraction pattern of a YSZ CCVD coating on an MgO substrate using 2-ethylhexanoate reagents.

FIG. 6 is an X-ray diffraction pattern of the first run with 10% atomic Y and 90% Zr AcAc in ethanol deposited on a single crystal (100) MgO substrate. The film created is very thin and not complete because of the low solubility of AcAcs and the short deposition time (10 min.) Note the high degree of preferred orientation as compared to the standard file card pattern shown in the lower part of the Fig. Preferred orientation is an indication of vapor deposition. FIG. 7 is an X-ray diffraction pattern of the second run using the same atomic ratio but with 2EH precursors in toluene deposited on a similar MgO substrate. Again, note the high degree of preferred orientation (heterogeneous nucleation) as compared to the standard file card pattern shown in the lower part of the Fig. In both cases the substrates were located in the flame near its end at temperatures of about 1200–1300° C. The films of runs 1 and 2 exhibited high degrees of preferred orientation. The film of run 2 was produced with 10 mole percent Y-2EH and 90 mole percent Zr-2EH in toluene deposited on MgO. A cubic YSZ film resulted as would be expected for this composition.

The YSZ coating was deposited on polycrystalline stainless steel from the 2EH-toluene solution using the same procedure. The 2EH concentrations were higher than the AcAc concentrations, so these films are thicker with better coverage. The solubility of the 2EH is much higher than the concentrations used.

EXAMPLE 3

Figure 4:
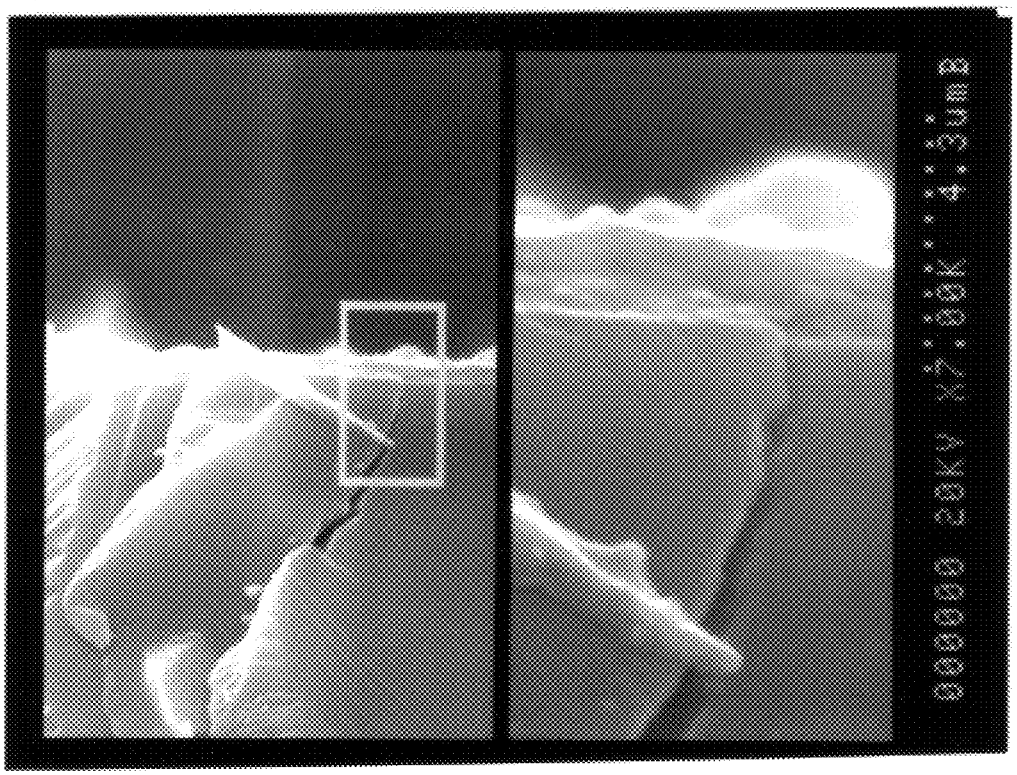
FIG. 4 is a cross-section of a photomicrograph of a YSZ CCVD coating on sapphire.

FIG. 4 is a cross section of a YSZ film on sapphire showing its dense structure and resistance to fracture. The post-deposition substrate fracture shown in FIG. 4 appears not to penetrate into the YSZ, showing the fracture toughness of the coating. The substrates were positioned about the flame's end to produce substrate temperatures of approximately 1200° C.

EXAMPLE 4

Figure 5:
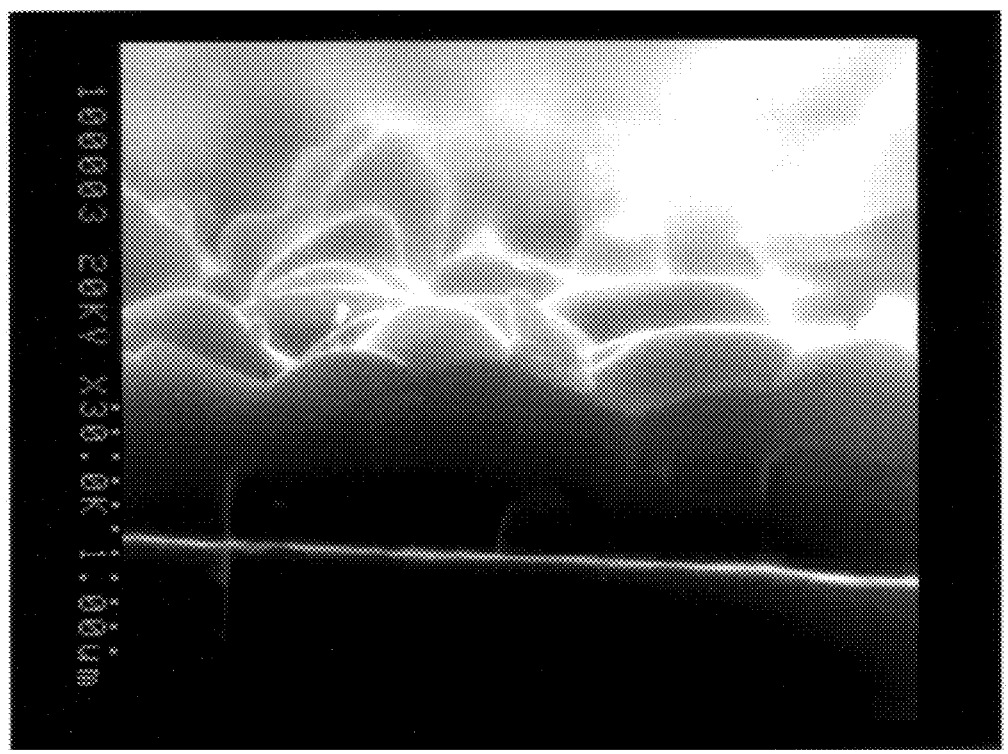
FIG. 5 is a reflected light photomicrograph of a $Y_2BaCuO_5$ CCVD coating on an MgO substrate.
Figure 8:
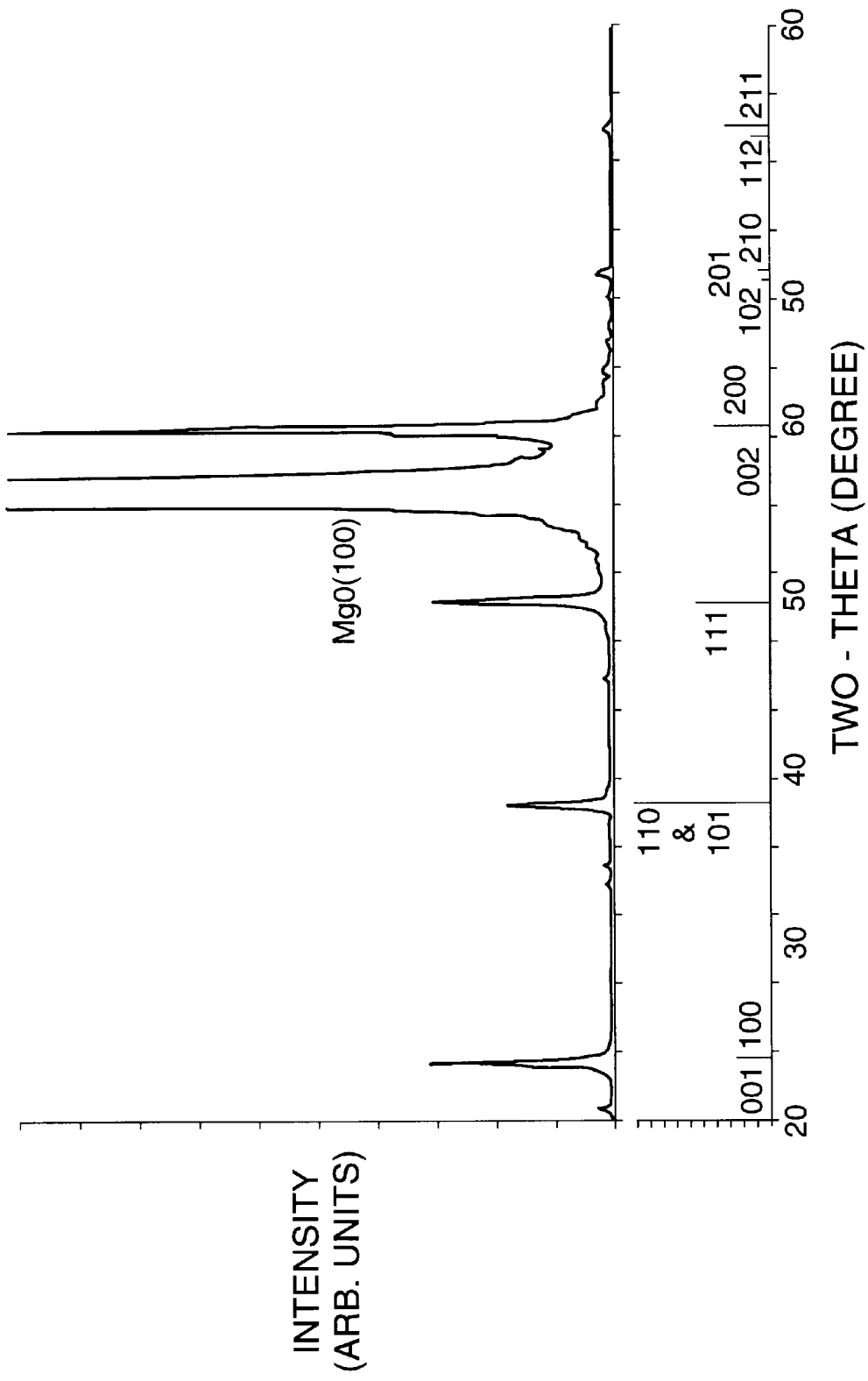
FIG. 8 is an X-ray diffraction pattern of a $BaTiO_3$ CCVD coating on the side of an MgO substrate opposite the flame using 2EH reagents.
Figure 9:
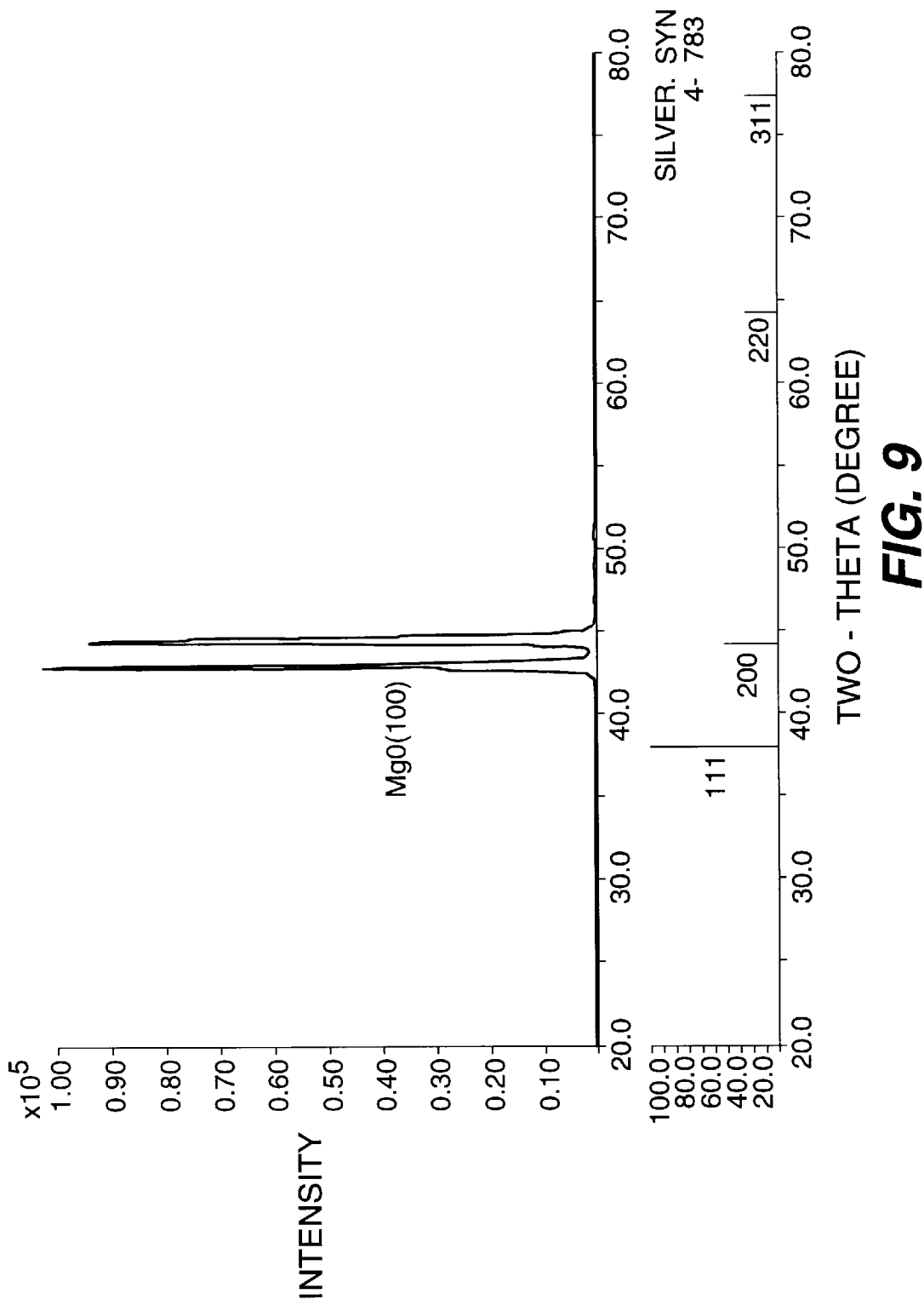
FIG. 9 is an X-ray diffraction pattern of an Ag CCVD coating on an MgO substrate using Ag nitrate as a reagent.
Figure 10:
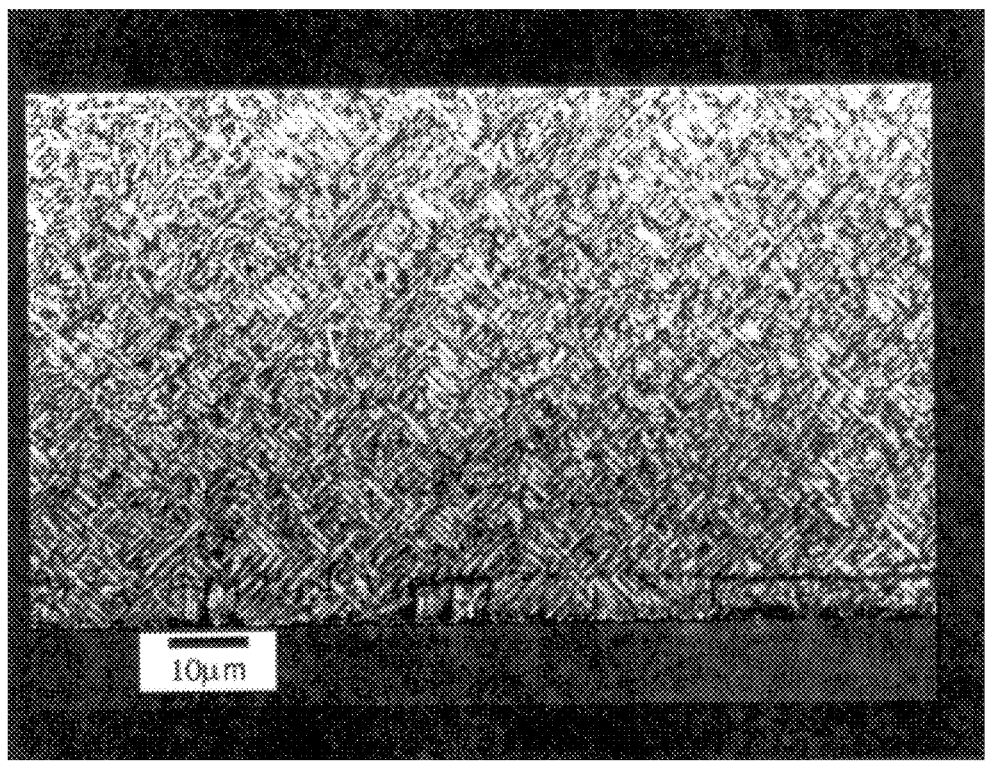
FIG. 10 is a photomicrograph of a cross-section of a $BaTiO_3$ CCVD coating on an MgO substrate.

Coatings of $BaTiO_3$, $Y_2BaCuO_5$, YIG ($Y_3Fe_5O_{12}$ or Yttrium Iron Garnet), Ag and Pt also have been deposited. FIG. 10 shows a cross section of a coating of dense $BaTiO_3$ on the flame side of an MgO substrate. The $BaTiO_3$ was deposited using 2EH precursors dissolved in toluene and was deposited on both sides of the substrate, towards and away from the flame. This shows that CCVD is not limited to line of sight deposition, as evidenced by the X-ray diffraction pattern of FIG. 8. FIG. 8 also shows a high degree of preferred orientation as compared to the standard file card pattern shown in the lower part of the Fig. YIG was deposited both with AcAc precursors in ethanol and with 2EH precursors in toluene. Energy dispersive X-ray showed the films were within 10 atomic percent of stoichiometry. XRD indicated that YIG was the major phase in both films. A predominantly $Y_2BaCuO_5$ film also was deposited and optical observation, the photomicrograph of FIG. 5, suggests epitaxial growth on a (100) MgO substrate. Ag was deposited from a solution of Ag nitrate in ethanol with 10% water. The XRD of FIG. 9, deposited at about 700° C. on (100) MgO, showed the Ag (200) peak about 500 times more intense than the maximum peak from a randomly oriented sample. The XRD of the Pt, which was deposited using Pt AcAc in ethanol and toluene, shows variation of the preferred orientation between (100) MgO and a-axis sapphire substrates. Ag, Pt, and all of the above oxides were successfully deposited in the first attempt which shows the great ease and flexibility of this deposition technique.

CCVD is a more versatile and less expensive coating technique than existing CVD for some applications. In principle, CCVD can be used to deposit coatings of oxides, nitrides, carbides, fluorides, borides, and some elements. The deposition of non-oxide coatings can be achieved, typically by using an open-ended flame enclosure tube with a fuel rich, oxygen poor, mixture and a source of anionic constituents, such as $N_2$ gas or nitrates for the deposition of nitrides. Non-oxide stable phases may require the use of non-carbon containing fuels so that carbon black would not form. Most depositions occur at atmospheric pressure, but many flames are stable to pressures as low as 10 torr. Alternating compositional layers could be deposited simply by switching solution or gas sources. The coating of complex shapes, large parts in the field, and the interior surfaces of certain parts with CVD quality is possible using CCVD.

The above detailed description of the preferred embodiments and Examples are presented for illustrative purposes only and are not intended to limit the spirit and scope of the present invention, and its equivalents, as defined in the appended claims.

What is claimed is:

1. A method for applying a thin film coating selected from the group consisting of a metal and an oxide to substrates using combustion chemical vapor deposition comprising the steps of:

(a) providing a substrate having at least one surface to be coated;

(b) selecting a reagent and a carrier medium and mixing together said reagent and said carrier medium to form a reagent mixture, the reagent being selected such that at least a portion of the reagent forms the thin film coating selected from the group consisting of the metal and the oxide;

(c) combusting at least a portion of said reagent mixture thereby vaporizing a majority of said reagent to form a vapor phase of said reagent;

(d) locating said substrate in a zone such that the substrate is heated sufficiently to allow said vapor phase to form the thin film coating on said substrate; and (e) contacting said vapor phase of said reagent with said substrate in said zone for forming the thin film coating selected from the group consisting of the metal and the oxide onto said substrate.

2. The method as claimed in claim 1, wherein said coating is less than about 10 microns in thickness.

3. The method as claimed in claim 2, wherein said coating is a crystalline film.

4. The method as claimed in claim 2, wherein said reagent mixture is a liquid solution and said coating is a non-crystalline film.

5. The method as claimed in claim 2, wherein said reagent mixture is flammable.

6. The method as claimed in claim 2, wherein the combustion step comprises the steps of:
   providing a combustion means; and
   providing an oxidant to said combustion means to assist in combusting said reagent mixture.

7. The method as claimed in claim 6, wherein a fuel capable of combustion is supplied to said combustion means to fuel said combusting of said reagent mixture.

8. The method as claimed in claim 2, wherein said carrier medium is a liquid organic solvent.

9. The method as claimed in claim 2, wherein said reagent is a gas, a vapor, or a liquid and said carrier medium is a gas, a vapor, or a liquid.

10. The method as claimed in claim 9, wherein said reagent mixture is a liquid solution and said vapor phase consists essentially of vapors of said reagent.

11. Method as in claim 1 wherein the combustion step includes substantially completely vaporizing said reagent.

12. The method as claimed in claim 2, wherein said coating is epitaxial.

13. The method as claimed in claim 8, wherein said reagent mixture is a liquid solution which comprises solid particles of said reagent and said vapor comprises vapors of said reagent and solid particles of said reagent.

14. The method as claimed in claim 10, wherein said coating is an essentially heterogeneously nucleated film comprising said reagent.

15. The method as claimed in claim 13, wherein said coating is a film comprising solid particles of said reagent.

16. The method as claimed in claim 2, wherein said coating is less than about 1 micron in thickness.

17. The method as claimed in claim 2, wherein said substrate is heated predominantly by the heat of combustion produced by combusting said reagent mixture.

18. The method as claimed in claim 2, wherein said substrate is heated predominantly by a secondary heat source.

19. The method as claimed in claim 8, wherein said coating is thermodynamically stable in an oxidizing environment having a temperature of approximately 300° C. or higher.

20. The method as claimed in claim 8, wherein said coating is not stable in an oxidizing high temperature environment.

21. The method as claimed in claim 19, wherein said reagent is a metalorganic compound.

22. The method as claimed in claim 20, wherein additional reactants are supplied to said combustion means proximate to but just beyond said flame.

23. The method as claimed in claim 8, wherein said reagent mixture further comprises non-reactive particles which deposit on said substrate with said coating.

24. The method as claimed in claim 23, wherein said non-reactive particles are molten when striking said substrate.

25. The method as claimed in claim 2, wherein said flame has a temperature of between about 300° C. and 2800° C., said substrate has a surface temperature of between about 100° C. and 2200° C., and said deposition occurs at a pressure of between about 10 torr and 10,000 torr.

26. The method as claimed in claim 25, wherein said coating is deposited on said substrate at a deposition rate of between about 0.1 $\mu$m/hr and 1000 $\mu$m/hr.

27. The method as claimed in claim 26, wherein said substrate has a surface temperature of between about 400° C. and 1300° C.

28. The method as claimed in claim 2, wherein said deposition occurs at atmospheric pressure.

29. The method as claimed in claim 1, further comprising the step of alternating the reagent from one of a plurality of different reagents to another of a plurality of different reagents so that said coating has a plurality of different compositional oxide layers.

30. The method as claimed in claim 29, wherein said coating is less than about 1 micron in thickness.

31. The method as claimed in claim 2, wherein the reagent mixture comprises a plurality of different oxide-forming reagents so that said coating includes a plurality of different oxides.

32. A method for applying to substrates using combustion chemical vapor deposition a multilayer thin film coating comprising metal, oxide, or metal and oxide, the method comprising the steps of:
   (a) providing a substrate having at least one surface to be coated;
   (b) selecting a plurality of reagents and corresponding carrier mediums and mixing together said plurality of reagents and said respective carrier mediums to form a plurality of respective reagent mixtures, the reagents being selected such that at least a portion of each reagent forms the metal, oxide, or metal and oxide thin film coating;
   (c) selectively combusting at least a portion of each reagent mixture in series by switching from one of said reaction mixtures to another of said reaction mixtures thereby serially vaporizing a majority of each of the respective reagents to form a vapor phase of said reagents;
   (d) locating said substrate in a zone such that the substrate is heated sufficiently to allow said vapor phase to form the multilayer thin film coating on said substrate; and
   (e) contacting said vapor phase of said reagents with said substrate in said zone for forming the metal, oxide, or metal and oxide multilayer thin film coating onto said substrate.

33. The method as claimed in claim 32, wherein said coating has a thickness less than about 1 micron.

34. Method as in claim 32 wherein the combustion step includes substantially completely vaporizing said reagents.

35. The method as claimed in claim 1 wherein said carrier medium is added proximal to the combustion.

36. The method as claimed in claim 1 wherein said combustion produces a flame.

37. The method as claimed in claim 36 further comprising maintaining the flame with a hot ignition source.

38. A method for applying a metal or an oxide containing thin film coating to substrates comprising the steps of:
   (a) providing a substrate to be coated;
   (b) selecting a reagent such that at least a portion of the reagent forms the metal or oxide containing thin film coating;
   (c) exposing the reagent to a combustion reaction so that at least a majority of the reagent is in a vapor state in which the reagent is capable of vapor deposition; and
   (d) contacting said reagent in said vapor state with said substrate and thereby forming the metal or oxide containing thin film coating onto at least a portion of said substrate.

39. The method as claimed in claim 38 further comprising mixing the reagent with a carrier medium to form a reagent mixture before exposing the reagent to the combustion reaction.

40. The method as claimed in claim 39 wherein said carrier medium is added proximal to the combustion reaction.

41. The method as claimed in claim 38 wherein said combustion reaction produces a flame.

42. The method as claimed in claim 41 further comprising maintaining the flame with a hot ignition source.

43. The method as claimed in claim 39 wherein the combustion reaction includes combusting the reagent mixture.

44. The method as claimed in claim 39 wherein said reagent mixture is a liquid solution.

45. The method as claimed in claim 38, wherein said coating is less than about 10 microns in thickness.

46. The method as claimed in claim 38, wherein said coating is less than about 1 micron in thickness.

47. The method as claimed in claim 38, wherein said deposition occurs at atmospheric pressure.

48. The method as claimed in claim 38, wherein said coating is a crystalline film.

49. The method as claimed in claim 39, wherein said reagent mixture is a liquid solution and said coating is a non-crystalline film.

50. The method as claimed in claim 39, wherein said carrier medium is a liquid organic solvent.

51. The method as claimed in claim 38, wherein said coating is epitaxial.

52. The method as claimed in claim 39, wherein said reagent mixture is a liquid solution which comprises solid particles of said reagent and said vapor comprises vapors of said reagent and solid particles of said reagent.

53. The method as claimed in claim 41, wherein said flame has a temperature of between about 300° C. and 2800° C., said substrate has a surface temperature of between about 100° C. and 2200° C., and said deposition occurs at a pressure of between about 10 torr and 10,000 torr.

54. The method as claimed in claim 38, further comprising the step of alternating the reagent from one of a plurality of different reagents to another of a plurality of different reagents so that said coating has a plurality of different compositional oxide layers.

\* \* \* \* \*

UNITED STATES PATENT AND TRADEMARK OFFICE
CERTIFICATE OF CORRECTION

PATENT NO.    : 6,013,318
DATED         : January 11, 2000
INVENTOR(S)   : Hunt et al.

Page 1 of 1

It is certified that error appears in the above-identified patent and that said Letters Patent is hereby corrected as shown below:

Column 1,
Line 5, insert -- This invention was made with Government support under contract DOE-AC05-840R21400 awarded by the Department of Energy. The Government has certain rights in the invention. --.

Signed and Sealed this

Twenty-fourth Day of January, 2006

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,013,318 |
| APPLICATION NO. | : 09/161571 |
| DATED | : January 11, 2000 |
| INVENTOR(S) | : Hunt et al. |

It is certified that error appears in the above-identified patent and that said Letters Patent is hereby corrected as shown below:

In column 1, before "CROSS REFERENCE TO RELATED APPLICATIONS" the following paragrapgh should be substituted for the paragraph entered in a previous "Certificate of Correction" dated 24 January 2006.

-- This invention was made with Government support under contract DOE-AC05-840R21400 awarded by the Department of Energy. The Government has certain non-transferable rights in the invention. --

Signed and Sealed this

Twenty-ninth Day of August, 2006

JON W. DUDAS
*Director of the United States Patent and Trademark Office*